United States Patent [19]
Henaux

[11] Patent Number: 6,074,886
[45] Date of Patent: Jun. 13, 2000

[54] ELECTRICAL CHARACTERIZATION OF AN INSULATING LAYER COVERING A CONDUCTING OR SEMICONDUCTING SUBSTRATE

[75] Inventor: Stéphane Henaux, Grenoble, France

[73] Assignee: Commissariat a l'Energie Atomique, Paris, France

[21] Appl. No.: 09/156,127

[22] Filed: Sep. 17, 1998

[30] Foreign Application Priority Data

Oct. 9, 1997 [FR] France .................................. 97 12604

[51] Int. Cl.[7] .................................................. H01L 21/66
[52] U.S. Cl. .................................. 438/17; 438/14; 257/48
[58] Field of Search .............................. 438/17, 14, 18, 438/149, 11; 257/48, 727; 324/770

[56] References Cited

U.S. PATENT DOCUMENTS

| | | | |
|---|---|---|---|
| 5,907,764 | 5/1999 | Lowell et al. | 438/17 |
| 6,014,034 | 1/2000 | Arora et al. | 324/769 |

FOREIGN PATENT DOCUMENTS

| | | | |
|---|---|---|---|
| 581703 | 7/1993 | European Pat. Off. | H01L 21/66 |
| 63-142826 | 6/1988 | Japan | H01L 21/66 |
| 02275364 | 11/1990 | Japan | G01R 1/067 |
| 96/23319 | 8/1996 | WIPO | H01L 21/66 |

OTHER PUBLICATIONS

Wang H et al, An Optimized Gate Oxide Breakdown Test By Activating Oxide Traps at Low Fields, Dec. 13, 1992, pp. 143–146.

IBM Technical Disclosure Bulletin, Characterizing Weak Spots in Dielectric Layers, Sep. 1991, vol. 34, No. 4B, p. 98–99.

*Primary Examiner*—Mary Wilczewski
*Assistant Examiner*—Calvin Lee
*Attorney, Agent, or Firm*—Hayes, Soloway, Hennessey, Grossman & Hage PA

[57] ABSTRACT

The present invention relates to the characterization of an insulating layer (14), a first surface of which covers a conducting or semiconducting surface of a substrate, the second surface of the insulating layer (14) being electrically accessible, the characterization consisting of verifying the quality of electrical insulation presented by at least one area (32) of the insulating layer (14) by means of an electrical test. The invention comprises the following steps:

create at least one major defect in an area (31, 33) in the insulating layer (14), this major defect forming a short circuit located between the second surface of the insulating layer and the said conducting or semiconducting surface of the substrate, apply the electrical test to the area (32) of the insulating layer (14) to be tested by means of an electrical signal output between an electrode (21, 23) put into contact with the major defect and an electrode (22) put into contact with the area (32) to be tested.

6 Claims, 4 Drawing Sheets

ELECTRICAL CHARACTERIZATION OF AN INSULATING LAYER COVERING A CONDUCTING OR SEMICONDUCTING SUBSTRATE

DESCRIPTION

TECHNICAL DOMAIN

This invention relates to a process for electrical characterization of an insulating layer covering a conducting or semiconducting substrate. It also relates to a device for embodiment of this characterization process.

STATE OF THE ART

It is often necessary to verify the quality of an insulating layer deposited on a semiconducting substrate, particularly in the semiconductors domain. For example, grid oxide is an essential element in MOS (Metal Oxide Semiconductor) integrated circuits. The quality of this oxide depends very much on the initial semiconducting substrate.

Therefore it is advantageous to determine the quality of the grid oxide of a MOS device to be made on a given substrate type in advance, without the need to make the device. One known process for achieving this result is to deposit an oxide layer (subsequently called a thin oxide) of the same type as the required grid oxide on one entire surface (or the front surface) of a control substrate and electrically testing this thin oxide between a front contact and a back contact. The back contact is normally a conducting metal plate located on the back surface of the control substrate. Manufacturing of the front contact must not degrade the thin oxide deposited on the front surface of the substrate. This front contact has a given contact area that defines the oxide portion being tested.

Mercury probes are used to make the two contacts. Many instruments have been marketed. FIG. 1 illustrates the principle used applied to a silicon substrate 1 covered by a silica layer 2 on its front surface 3. Contact with the back surface 4 of the substrate 1 is made by a metal plate 5 connected to the ground. The front contact, with the free surface of thin oxide 2, is made by a mercury electrode 6 that applies a voltage V with respect to the ground.

The simplest test consists of detecting major defects, in other words local short circuits in the thin oxide. For example, these short circuits may be due to a silicon excroissance projecting from the substrate. The test takes place by moving the mercury electrode across the free surface of the thin oxide 2. If the front contact is placed on an oxide portion containing a major defect, a leakage current I is measured even at low values of the voltage V.

It is also possible to study any minor defects that may be present in the oxide portion studied. This is done by gradually increasing the voltage V starting from zero and recording the value $V_{bd}$ for which the current I suddenly starts to increase. The value $V_{bd}$ is called the breakdown voltage of the thin oxide in the oxide portion being tested.

In the previous test, the insulating layer was placed on a semiconducting material forming a substrate, and the back contact comes into contact with the back surface of this substrate. This test proves to be impossible to carry out in some cases, for example an SOI (Silicon On Insulator) substrate as shown in FIG. 2. This substrate comprises a silicon ground 10 forming the initial substrate and with a back surface 11. An oxide layer 12, called the buried oxide layer was grown on the opposite surface and a silicon layer 13 was then added. This SOI substrate formed in this way is then covered by a thin oxide layer 14, that has to be tested. Obviously, this type of structure cannot be tested in the same way as before, since the buried oxide 12 opposes current passing between the thin oxide 14 and its back surface 11 even if there is a defect in the thin oxide portion being tested.

One possible solution would be to make the measurement between two contacts on the free surface of the thin oxide 14. A first method would consist of keeping the thin oxide over the entire surface of the substrate. In this case, a high current I would only be measured if there is a defect in the thin oxide in each of the two contacted oxide portions. A defect present in one of the two portions would not be detected if the other oxide portion was intact.

A second method would consist of eliminating the thin oxide locally so as to place one of the two front contacts on the silicon film. This represents a technological step that can degrade the thin oxide to be tested. Furthermore, it is very difficult to optically distinguish between areas covered with thin oxide and areas not covered, since the thin oxide is practically transparent. Therefore it would be difficult to position the contacts.

DESCRIPTION OF THE INVENTION

In order to overcome this problem, this invention proposes a solution based on the following principle. Firstly, a major defect is created artificially in the insulating layer to be tested, forming a short circuit under one of the contacts of the measurement device. An electrical conduction test is then carried out between the contact placed on the major defect and another test contact placed on the portion of the insulating layer to be tested.

Therefore the purpose of the invention is a process for characterization of an insulating layer, the first surface of which covers a conducting or semiconducting surface of the substrate, the second surface of the insulating layer being electrically accessible, the characterization consisting of verifying the quality of electrical insulation presented by at least one area of the insulating layer by means of an electrical test, characterized in that it comprises the following steps:

create at least one major defect in an area in the insulating layer, this major defect forming a short circuit located between the second surface of the insulating layer and the said conducting or semiconducting surface of the substrate, application of the electrical test to the area of the insulating layer to be tested by means of an electrical signal output between an electrode put into contact with the said major defect and an electrode put into contact with the said area to be tested.

The major defect may be obtained by application of an electrical voltage with a sufficiently high value to cause breakdown of the insulating layer. This electrical voltage may be applied by means of two electrodes put into electrical contact with the second surface of the insulating layer, thus creating two major defects in the insulating layer, one or both of these major defects being used for application of the electrical test.

The major defect may also be obtained mechanically, by crossing through the insulating layer.

The major defect may be created in an annular shaped area centered on the area of the insulating layer to be tested.

Preferably, the electrical test consists of applying an electrical voltage between the said electrodes and then recording the current, if any, passing between the said electrodes. The electrical voltage applied between the electrodes can then be a voltage ramp.

One particularly interesting application of the invention relates to a semiconducting substrate comprising a buried insulating layer and a surface insulating layer which is the insulating layer to be tested. In particular, this semiconducting substrate may be a Silicon-On-Insulator substrate, in which the buried layer is a silicon oxide layer and the surface insulating layer is also a silicon oxide layer. Advantageously, the silicon subjacent to the surface oxide layer is maintained under strong illumination during application of the electrical test in order to facilitate the generation of minority carriers. Another way of favoring generation of minority carriers is to increase the temperature of the silicon subjacent to the surface oxygen layer so that it exceeds the ambient temperature while the electrical test is being carried out.

Another purpose of the invention is a device for characterization of an insulating layer, in which the first surface covers a conducting or semiconducting surface of a substrate, the second surface of the insulating layer being electrically accessible, the characterization consisting of verifying the quality of the electrical insulation presented by at least one area of the insulating layer by means of an electrical test, characterized in that it comprises:

means of creating at least one major defect in an area of the insulating layer, this major defect forming a short circuit located between the second surface of the insulating layer and the said conducting or semiconducting surface of the substrate, means of applying the electrical test to the area of the insulating layer to be tested by means of an electrical signal supplied between an electrode that can be put into contact with the said major defect and an electrode that can be put into contact with the said area to be tested.

The device may comprise at least three electrodes that can be put into contact with the second surface of the insulating layer, two of these electrodes being used to apply a breakdown voltage to the insulating layer in order to create two major defects, the third electrode being used to apply the said electrical test, with at least one of the other two electrodes.

The means of creating at least one major defect may also be mechanical means operating through the insulating layer.

The electrode used to jointly apply the breakdown voltage and the electrical test may have an annular contact area, the electrode that can be put into contact with the area to be tested being centered on the annular contact area.

The electrical test application electrodes may be mercury electrodes.

Advantageously, the means of applying the electrical test output an electrical signal in the shape of a ramp between the major defect and the said area to be tested.

Preferably, the means of applying the electrical test comprise means capable of accessing the measurement of the current circulating between electrodes used for application of the electrical test.

BRIEF DESCRIPTION OF THE FIGURES

The invention will be better understood and other advantages and specific features will become clear from the following description, given as a non-limitative example, accompanied by the attached drawings in which.

DETAILED DESCRIPTION OF EMBODIMENTS OF THE INVENTION

Figure 1:
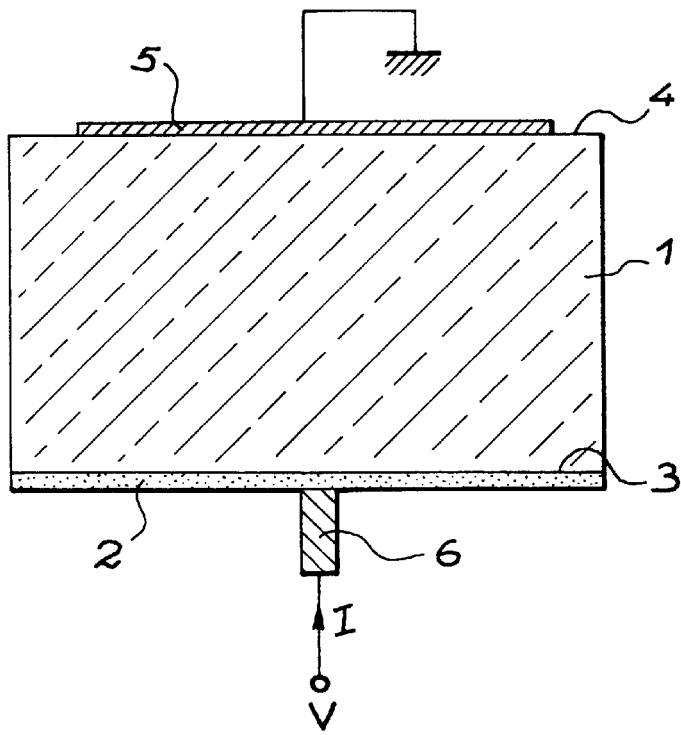
FIG. 1 illustrates a process for electrical characterization of a silica layer covering a silicon substrate according to known art.
Figure 2:
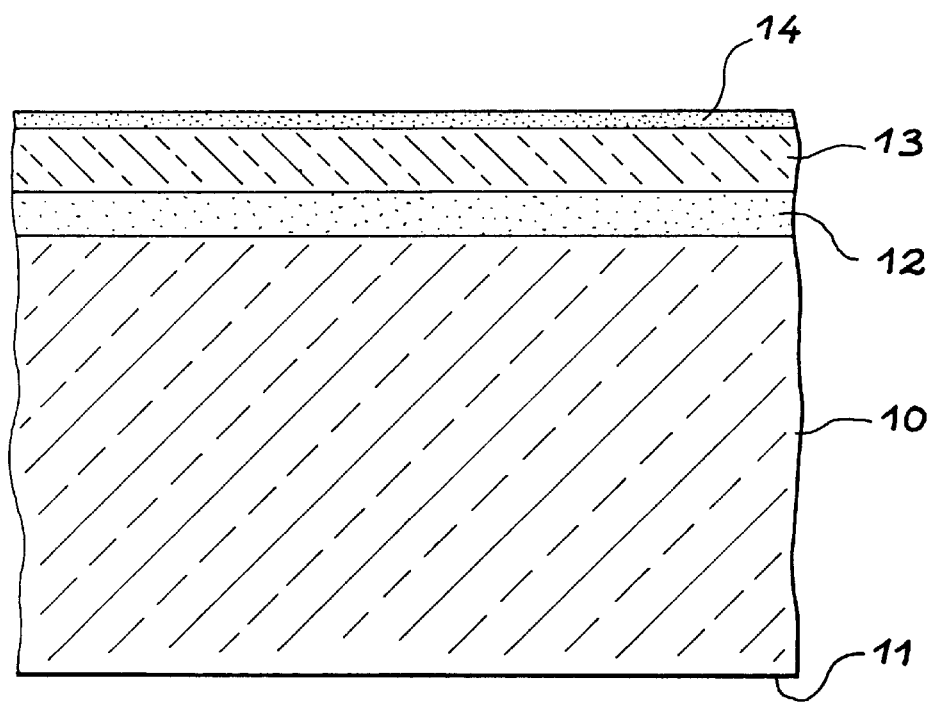
FIG. 2 illustrates a Silicon-On-Insulator substrate covered by a silica oxide layer.
Figure 3:
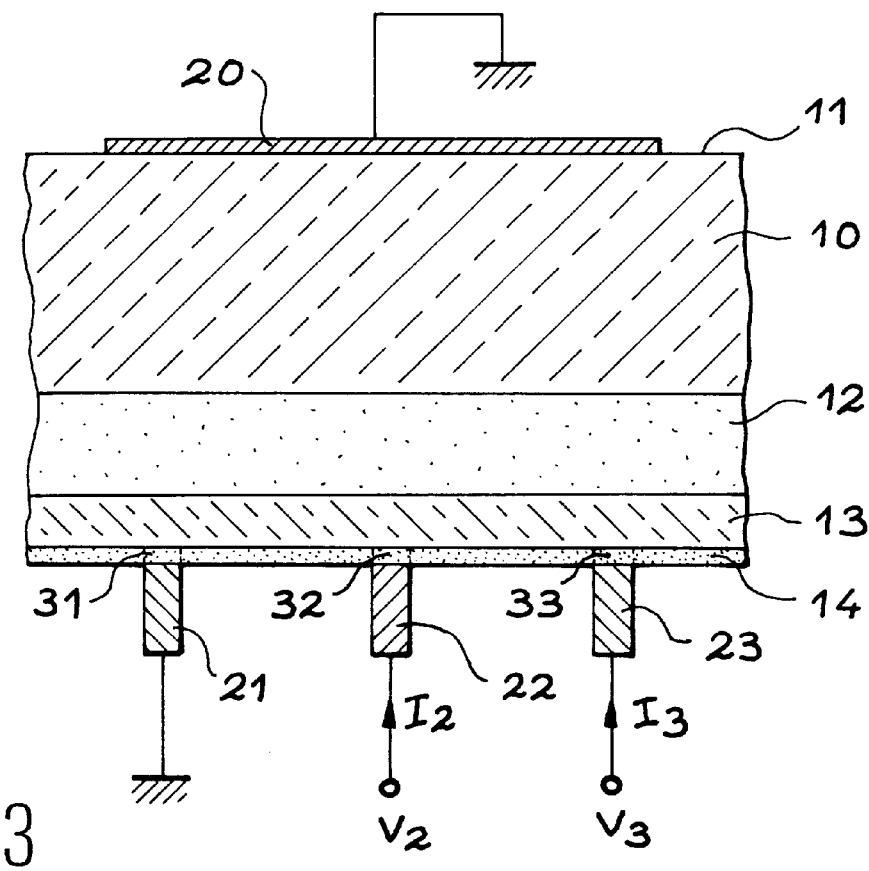
FIG. 3 illustrates the electrical characterization process according to this invention applied to a substrate of the type shown in FIG. 2, FIGS. 4, 5 and 6 represent current-voltage curves.

FIG. 3 illustrates the process according to this invention in the case of the substrate shown in FIG. 2. The characterization device used comprises a mercury probe with three or more contacts. The back surface 11 is grounded by means of a plate electrode 20. The thin oxide surface opposite the surface that is in contact with the silicon layer 13 and which has a thickness of between 3 and 1000 nm, is put into contact with three mercury electrodes 21, 22 and 23.

The first step is to make the major defects in the thin oxide 14 by electrical breakdown. This is done by grounding electrode 21, leaving electrode 22 at a floating potential and applying a high voltage $V_3$, for example $-100V$, to electrode 23. Oxide portions 31 and 33, each containing a major defect, are then obtained in the thin oxide facing electrodes 21 and 23 respectively. The current $I_3$ circulating between electrodes 21 and 23 through the silicon layer 13 is measured, to ensure that these major defects have actually been created. For example, current $I_3$ will exceed 1 mA.

The electrical test can then be put into application for the thin oxide portion 32 facing electrode 22. This is done by applying a voltage ramp $V_2$ to electrode 22, electrode 23 being grounded, plate electrode 20 and electrode 21 also being grounded.

If there is a major defect in oxide portion 32, the current $I_2$ passing through electrode 22 increases strongly even for very small values of $V_2$. If there is no major defect, and there is simply a minor defect or no defect at all, the current $I_2$ is firstly very low and only starts to increase suddenly above a certain value of $V_2$, called the breakdown voltage $V_{bd}$.

Preferably, the front surface of the substrate is strongly illuminated at all times while the process is in use. The purpose of this illumination is to maximize the current in major defects which can be simply described as Schottky mercury-silicon junctions. When this type of junction is polarized directly, it does not oppose current passing. However, when it is inversely polarized, it only allows a low current called the leakage current to pass. Light facilitates the generation of minority carriers and maximizes the leakage current in the inverted junction(s).

Another solution for maximizing the current in major defects consists of increasing the temperature in major defects under electrodes 21 and 23.

The substrate on the front surface can be illuminated without any difficulty if the substrate support, in which vertical mercury channels are perforated for electrodes 21, 22 and 23, is made of a transparent material. The illumination must be sufficiently strong to significantly increase the leakage current. A 100 W halogen lamp (white) may be used focused on less than 1 cm$^2$.

Figure 4:
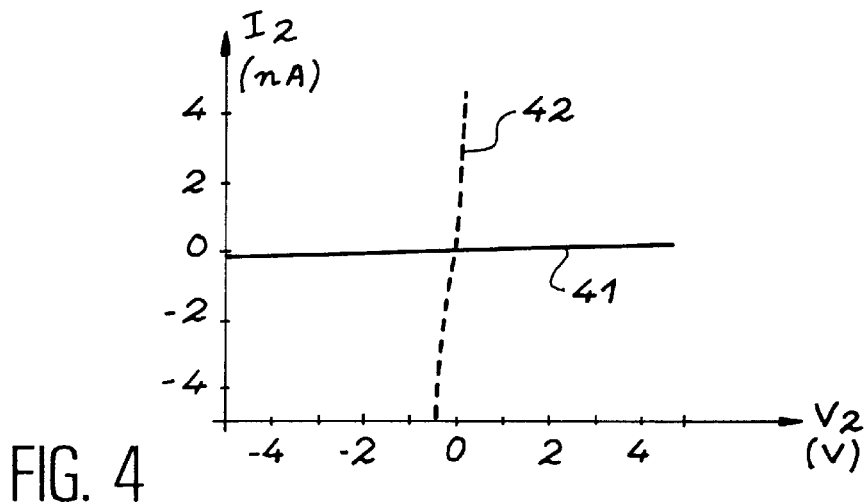
Figure 5:
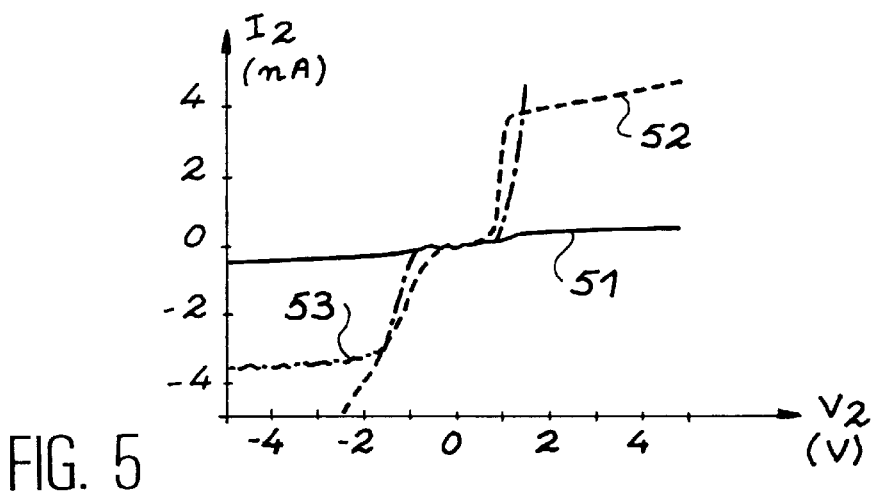
Figure 6:
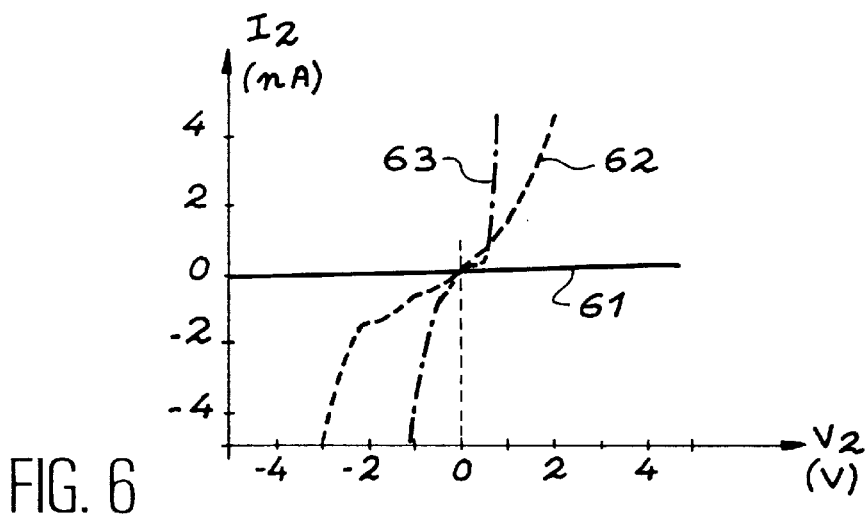

The diagrams in FIGS. 4, 5 and 6 give examples of the results obtained on different SOI substrates. These diagrams show the current $I_2$ in nA in the ordinate, and the voltage $V_2$ in volts in the abscissa.

The diagram in FIG. 4 presents the results obtained for a 15 nm thick thin oxide covering an SOI substrate, the subjacent silicon having n type doping at $10^{17}$ atoms/cm³. Curve 41 is typical of intact sites. Curve 42 shows a site with a major defect.

The diagram in FIG. 5 presents the results obtained for a 7.5 nm thick thin oxide covering an SOI substrate, the subjacent silicon not being doped. Curve 51 is typical of intact sites. Curves 52 and 53 correspond to sites with a major defect.

The diagram in FIG. 6 presents the results obtained for a 15 nm thick thin oxide covering an SOI substrate, the subjacent silicon not being doped. Curve 61 is typical of intact sites. Curves 62 and 63 correspond to sites with a major defect.

As can be seen, the process according to the invention is applicable to doped or undoped SOI substrates. Doped substrates have the highest currents on defective oxide portions since the resistance of the silicon film subjacent to the oxide is lower.

The process according to the invention may be extended to characterization devices (or probes) with more than three mercury electrodes. Each additional electrode can be used to test an additional oxide portion on each site. For example, a probe with four mercury electrodes can be used to test the thin oxide in two portions. Furthermore if these two contacts have different surfaces, defect studies can be carried out as a function of the tested surface.

Figure 7:
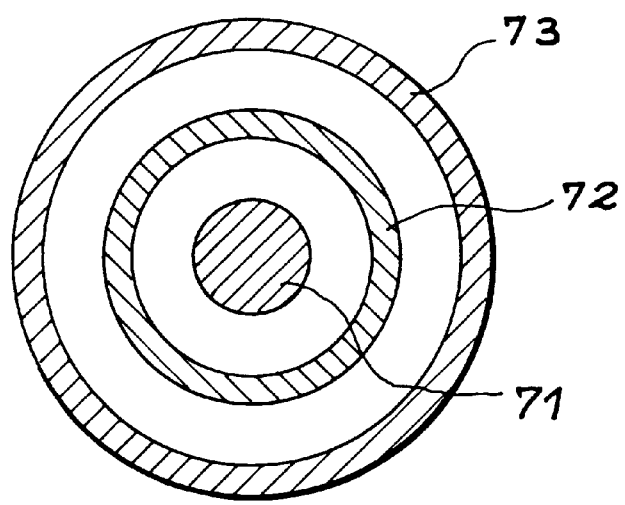
FIG. 7 shows an electrode layout for a characterization device according to this invention.

The shape of the mercury electrodes is not of overriding importance. One interesting possibility is to make the electrode used to create this major defect in the shape of a ring surrounding the test area. FIG. 7 shows this type of layout. There is a central test electrode 71, a first electrode 72 to obtain a first major defect by breakdown and a second electrode 73 to obtain a second major defect by breakdown, all laid out concentrically.

The fact that the same distance is maintained between the test electrode and the electrode used to create a major defect is an advantage, since the resistance of the portion of silicon located between the two electrodes is kept as constant as possible. This makes the tests more consistent.

The process according to this invention may be implemented using solid conducting contacts (metal pads, conducting polymer deposits) obtained by evaporation, deposition and etching or by any other method that does not degrade the thin oxide to be tested, depending on the case. However, the cost and time to make these conducting contacts may be an obstacle to their use.

Figure 8:
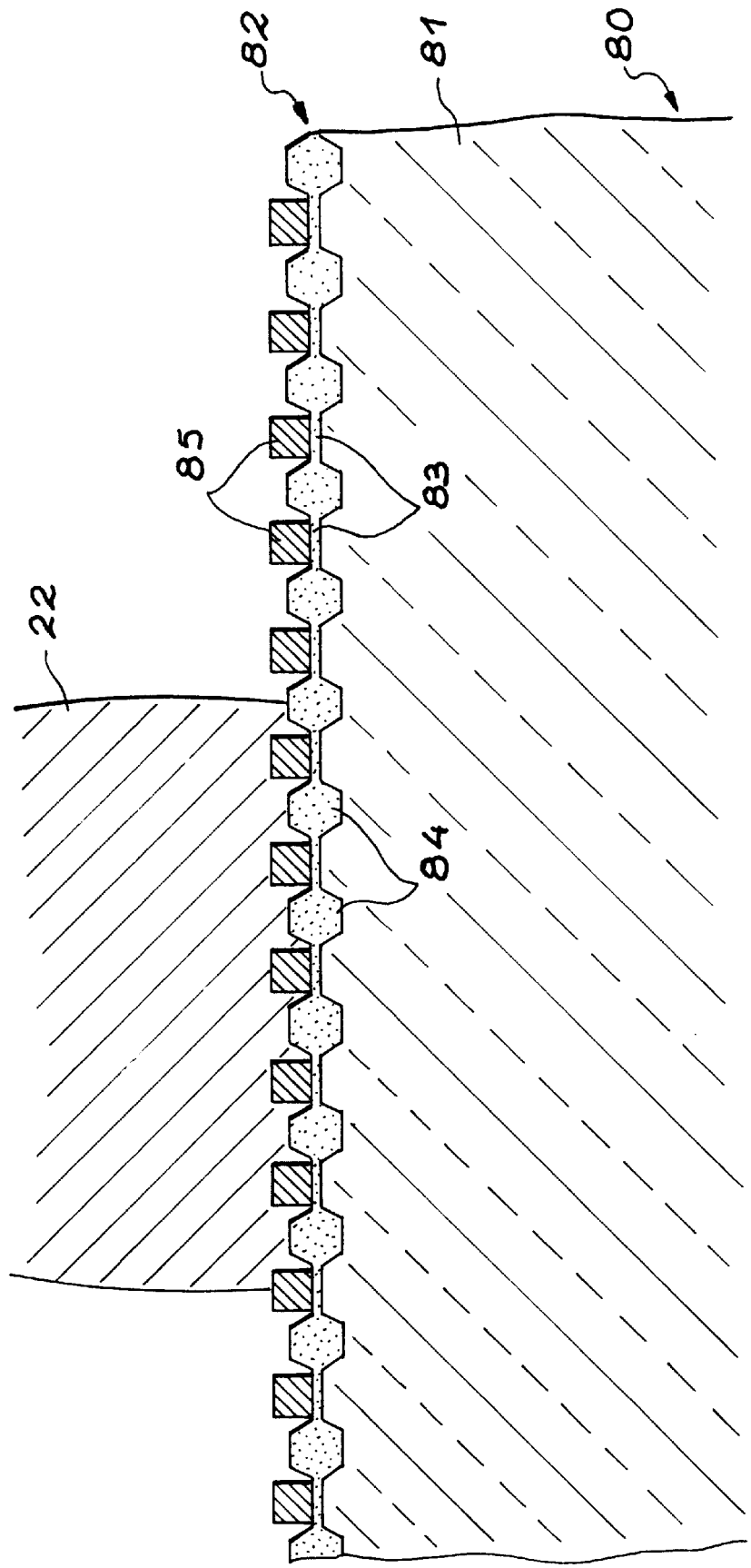
FIG. 8 shows details of an electrical contact between an electrode and a variable thickness insulating layer.

The insulating layer to be characterized may have a free surface or may be covered by a structure providing electrical access to this layer as shown in FIG. 8. This figure shows a substrate being characterized, at a very high magnification. The substrate 80 comprises a conducting or semiconducting part 81 covered by an insulating layer 82 with thickness variations. For example, if part 81 is made of silicon, the insulating layer 82 may be a silicon oxide layer with relatively thin portions 83 separated by thicker portions of LOCOS type oxide 84. Conducting pads 85, for example made of polycrystalline silicon, are placed on portions 83 and between portions 84. The electrodes in the characterization device, for example the mercury electrode 22, can then maintain electrical contact with the thin portions 83 of the oxide layer through conducting pads 85. obviously, the invention is applicable to substrates other than SOI substrates, for example SiC on insulator substrates.

This invention can be used with various manufacturing variants. For example, the same electrode can be used to form several major defects, so that a higher current can be used.

The electrical test may consist of applying an AC voltage to the area to be tested, and starting from the measurement of the circulating AC current, determining the impedance of the insulating layer (for example the silicon oxide layer) and of the subjacent material (for example the silicon) by analyzing its phase and amplitude. The oxide quality may be expressed in the form of a measurement of the resistance and capacitance, conductance and capacitance, inductance and resistance, inductance and impedance.

A variable voltage may be applied to the area to be tested according to a ramp, in steps or in pulses. For example, a voltage may be applied and the current I may be measured until the voltage drops to zero, with the duration t required to obtain a zero voltage. Another higher voltage is applied and the current and time required to obtain zero voltage is measured, and so on. For each interval, the quantity Ixt can then be measured until breakdown. The breakdown charge $Q_{bd}=\Sigma Ixt$ can then be determined.

As mentioned above, the electrical test can be carried out by measuring the current passing between the electrodes. The voltage may be measured instead of the current. The voltage may be servocontrolled such that the current obtained remains constant. The time after which the oxide breaks down is recorded, and the product of the current and the time is calculated to determine $Q_{bd}$ which is the charge that passed through the oxide during this time. The value Of $Q_{bd}$ can be used to characterize the oxide.

What is claimed is:

1. Process for characterization of an insulating layer, the first surface of which covers a conducting or semiconducting surface of a substrate, the second surface of the insulating layer being electrically accessible, the characterization consisting of verifying the quality of electrical insulation presented by at least one area of the insulating layer by means of an electrical test, characterized in that it comprises the following steps:

create at least one major defect in an area in the insulating layer, this major defect forming a short circuit located between the second surface of the insulating layer and the said conducting or semiconducting surface of the substrate, apply the electrical test to the area of the insulating layer to be tested by means of an electrical signal output between an electrode put into contact with the said major defect and an electrode put into contact with the said area to be tested.

2. Process according to claim 1, in which the major defect is obtained by application of a sufficiently high electrical voltage to cause breakdown of the insulating layer.

3. Process according to claim 2, in which the said electrical voltage is applied by means of two electrodes put into electrical contact with the second surface of the insulating layer thus creating two major defects in the insulating layer, one or both of these major defects being used for application of the electrical test.

4. Process according to claim 1, in which the said major defect is created in an annular shaped area centered on the area of the insulating layer to be tested.

5. Process according to claim 1, in which the electrical test consists of applying a voltage between the said electrodes and recording the current, if any, passing between the said electrodes.

6. application of the process according to claim 1 to a semiconductor substrate comprising a buried insulating layer and a surface insulating layer which is the insulating layer to be tested.

* * * * *